United States Patent [19]

Manocha et al.

[11] Patent Number: 5,135,886
[45] Date of Patent: Aug. 4, 1992

[54] INTEGRATED CIRCUIT FABRICATION UTILIZING AMORPHOUS LAYERS

[75] Inventors: Ajit S. Manocha, Allentown; Arun K. Nanda, Bethlehem; Virendra V. S. Rana, South Whitehall Township, Lehigh County, all of Pa.

[73] Assignee: AT&T Bell Laboratories, Murray Hill, N.J.

[21] Appl. No.: 622,993

[22] Filed: Dec. 6, 1990

[51] Int. Cl.$^5$ ............................................. H01L 21/20
[52] U.S. Cl. .............................. 437/101; 148/DIG. 1
[58] Field of Search .............................. 432/101, 233; 148/DIG. 1

[56] References Cited

U.S. PATENT DOCUMENTS 4,317,844  3/1982  Carlson ................................. 437/101

OTHER PUBLICATIONS

J. Electrochem. Soc.: Solid State Science and Technology, Oct. 1987, pp. 2541–2545, "The Effect of Low Pressure on the Structure of LPCVD Polycrystalline Silicon Films," P. Joubert et al.

*Primary Examiner*—Olik Chaudhuri
*Assistant Examiner*—G. Fourson
*Attorney, Agent, or Firm*—John T. Rehberg

[57] ABSTRACT

A process for the formation of material layers such as amorphous silicon is disclosed. When a precursor gas such as silane is utilized to form amorphous silicon, silicon crystals are often formed on top of the amorphous silicon layer. The crystals are created by the presence of low pressure silane in the reactor at the end of the deposition cycle. Formation of crystals is inhibited by lowering the temperature before silane flow is terminated.

6 Claims, 1 Drawing Sheet

INTEGRATED CIRCUIT FABRICATION UTILIZING AMORPHOUS LAYERS

TECHNICAL FIELD

The present invention relates to semiconductor integrated circuit fabrication in general, and more particularly to integrated circuit fabrication utilizing materials which undergo phase transformation.

BACKGROUND OF THE INVENTION

In the fabrication of integrated circuits, it is often customary to form various material layers by the decomposition of appropriate precursor materials. A typical example is the formation of amorphous silicon from the decomposition of silane gas. Amorphous silicon finds a variety of applications in integrated circuit technology, including use as an intermediate layer in poly-buffered LOCOS isolation technology. Generally, amorphous silicon is deposited within a reactor chamber utilizing a suitable precursor gas.

Traditionally, after a layer of suitable thickness has been deposited upon a substrate within a chamber, the deposition process is terminated by shutting off the flow of the precursor gas to the chamber.

SUMMARY OF THE INVENTION

Applicants have discovered that when the above process is performed, after an amorphous silicon layer is formed, a multiplicity of silicon crystals may be observed on top of the amorphous silicon layer. These silicon crystals may cause problems during subsequent process steps such as etching or oxide growth.

Applicants have found that the crystal formation problem is particularly troublesome in submicron technologies in which very little over-etching can be tolerated (e.g., during gate patterning). Older, larger linewidth technologies which permit greater over-etching may not appear to exhibit crystal formation, when in fact they do, because subsequent over-etching consumes the crystals.

Applicants have found that formation of silicon crystals is inhibited by reducing the temperature of the chamber before the silane is turned off. The reduced temperature helps to insure that the deposition process does not move from the amorphous to the crystalline silicon phase-field, hence silicon crystal formation on top of the already formed amorphous layer is inhibited.

The invention is applicable to the formation of other materials besides silicon. In an illustrative embodiment, the invention includes forming a layer of material which is capable of existence in at least two phases (one desired phase being associated with a temperature and a pressure). The formation is terminated by terminating the flow of the precursor gas, thereby reducing the pressure of the residual precursor gas in the reactor. Prior to termination, the temperature is changed to a second value so that the residual percursor gas tends to form material in the desired phase.

DETAILED DESCRIPTION

Figure 1:
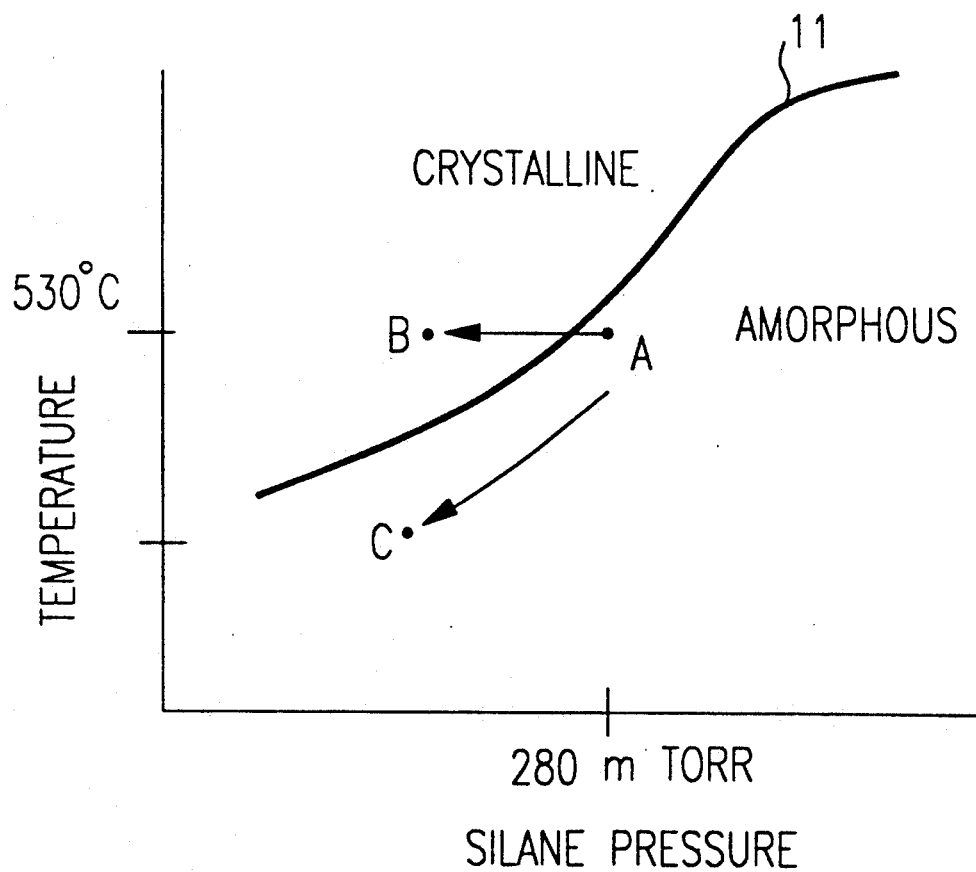
FIG. 1 is a schematic graph illustrating a phase transition experienced by silicon under certain deposition conditions and aiding in and understanding the present invention.

Typically, layers of amorphous silicon are deposited by utilizing the decomposition of silane in the reaction:

$$SiH_4 \rightarrow Si + 2H_2.$$

Other precursor gases may also be utilized. Examples of other suitable precursor gases are: $SiH_3Cl$, $SiH_2Cl_2$, $SiHCl_3$ and $Si_2H_6$ (disilane). Also, $H_2$ may be used as a reducing agent during the deposition. Also, gases such as nitrogen or argon may be used as inert carrier gases.

As mentioned before, applicant has observed the formation of small silicon crystals on top of layers of amorphous silicon formed by the above processes. These crystals are undesirable. They may cause contamination of subsequently deposited layers; they may interfere with subsequent etching (residual silicon particles may remain after etching); or they may create problems during subsequent oxide growth.

In a typical deposition process for amorphous silicon, the precursor gas flow is simply turned off (at the appropriate valve which is usually upstream from the reactor chamber) when the desired amorphous film thickness has been achieved.

The applicants have discovered that after the precursor gas is turned off, small amounts of precursor gas remain within feed tubes leading to the reactor and within the reactor itself. The small amount of residual precursor gas is at a lower pressure than the pressure employed for deposition. (Should another gas, such as hydrogen by employed in the reactor, the partial pressure of the precursor gas is reduced. As used throughout this application, the term "pressure" means partial pressure where appropriate.) As long as the temperature within the reactor remains relatively constant, the precursor gas will continue to pyrolize or decompose at a reduced pressure, leading to the formation of crystalline (rather than amorphous) silicon on top of the already-formed amorphous silicon layer.

The phenomenon can be understood by reference to FIG. 1, a graph which schematically illustrates a phase transition which occurs in silicon. Curve 11 schematically represents the locus of transition points between amorphous and crystalline forms of silicon. Typical deposition processes utilizing silane in an LPCVD reactor are characterized by the point labeled A on the graph of FIG. 1. It will be noted, for example, that at a pressure of approximately 280 mTorr and a deposition temperature of approximately 570° C. in an LPCVD reactor, amorphous silicon layers are formed from the decomposition of silane. However, should the silane gas flow be shut off (without a corresponding reduction in temperature) residual quantities of silane at a reduced pressure will continue to react for a short period of time. The reaction will ultimately take place at a point designated B on the graph of FIG. 1. Consequently, small amounts of crystalline silicon will begin to form on top of the already-deposited amorphous layer. Crystal formation is most noticeable when the temperature remains at 560°–570° C. Small crystals may still be observed at temperatures as low as 530° C.

To prevent the formation of crystals, applicants reduce the temperature of the wafer to a value sufficiently below 530° C. before the precursor gas flow is shut off. Thus, referring to FIG. 1, the temperature is reduced to a value corresponding to point C. After the precursor gas flow is turned off, the reaction proceeds from point A to point C. Both points are within the amorphous region of the graph. Consequently, the formation of crystalline silicon particles is prevented. If precursors other than silane are used (e.g., $SiH_3Cl$, $SiH_2Cl_2$, $SiHCl_3$, $Si_2H_6$), the precise temperatures mentioned above may change, but the inventive principle remains the same. The following example illustrates in detail the inventive process.

EXAMPLE

A layer of amorphous silicon was formed during a poly-buffered LOCOS process within an LPCVD horizontal hot wall chamber tube manufactured by Bruce/BTU Inc. Silane at a pressure of 280 mTorr was introduced with the tube temperature at 570° C. An amorphous film of approximately 550Å was deposited within approximately 25 minutes.

Then the supply of silane to the chamber was shut off by closing the inlet valve. No temperature adjustment was made. The wafers remained in the chamber for approximately an additional 5 minutes. The chamber was then evacuated and backfilled with atmospheric nitrogen. Examination of the wafers revealed silicon crystals up to 250–300Å in diameter on the surface of the amorphous layer, using a scanning electron microscope (SEM).

Another amorphous deposition was performed under the same conditions. However, furnace power was shut off and as soon as the furnace temperature reached 500° C., the silane was shut off. SEM analysis of the wafers showed a smooth amorphous surface with no evidence of any silicon crystals.

We claim:

1. A method of semiconductor fabrication comprising:

forming a layer of silicon material, said silicon material being capable of existence in at least a desired amorphous and undesired crystalline phase;

said formation occurring in a reactor utilizing a precursor gas flowing at a first temperature and a first pressure associated with said desired phase of said material;

terminating said formation process by shutting of the flow of said precursor gas, thereby reducing the pressure of said precursor gas in said reactor to a pressure sufficient to cause formation of additional material in said undesired phase, characterized by prior to said terminating step, changing the temperature to a second temperature whereby said precursor gas at said reduced pressure forms silicon material in said desired phase rather than in said undesired phase.

2. The method of claim 1 in which said first temperature is approximately 530°–570° C.

3. The method of claim 1 in which said first pressure is 1 Torr or less.

4. The method of claim 1 in which said second temperature is 500° C. or lower.

5. The method of claim 1 in which said precursor gas is chosen from the group consisting of silane, $SiHCl_3$, $SiH_2SiH_3Cl$ and disilane.

6. A method of semiconductor fabrication comprising:

forming a layer of amorphous silicon in a reactor utilizing flowing silane at a pressure of approximately 280 mTorr±10%, and a temperature of approximately 530°–570° C.

reducing the temperature to substantially less than 530° C.; and then terminating said silane flow, thereby inhibiting the formation of undesired particles of crystalline silicon.

* * * * *